US008669578B2

(12) United States Patent
Shibamoto et al.

(10) Patent No.: US 8,669,578 B2
(45) Date of Patent: Mar. 11, 2014

(54) WAVELENGTH CONVERSION PARTICLE, WAVELENGTH CONVERSION MEMBER USING SAME, AND LIGHT EMITTING DEVICE (75) Inventors: Shinji Shibamoto, Osaka (JP); Keiichi Yamazaki, Nara (JP); Shunpei Fujii, Osaka (JP); Tomokazu Kusunoki, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/497,723

(22) PCT Filed: Sep. 24, 2010

(86) PCT No.: PCT/JP2010/066491
§ 371 (c)(1),
(2), (4) Date: Jul. 10, 2012

(87) PCT Pub. No.: WO2011/037159
PCT Pub. Date: Mar. 31, 2011

(65) Prior Publication Data
US 2013/0001619 A1    Jan. 3, 2013

(30) Foreign Application Priority Data

Sep. 25, 2009 (JP) ................................. 2009-221504

(51) Int. Cl.
*H01L 33/00* (2010.01)
(52) U.S. Cl.
USPC .......................................................... 257/98
(58) Field of Classification Search
USPC .............................................. 257/98; 313/503
See application file for complete search history.

(56) References Cited

U.S. PATENT DOCUMENTS 6,734,466 B2   5/2004   Chua
8,138,666 B2   3/2012   Harada
(Continued)

FOREIGN PATENT DOCUMENTS

JP   2003-286480 A   10/2003
JP   2006-100730 A   4/2006
(Continued)

OTHER PUBLICATIONS
International Search Report for corresponding International Application No. PCT/JP2010/066491 mailed Oct. 19, 2010.
(Continued)

*Primary Examiner* — Yu-Hsi D Sun
*Assistant Examiner* — Christina Sylvia
(74) *Attorney, Agent, or Firm* — Renner, Otto, Boisselle & Sklar, LLP (57) ABSTRACT A wavelength conversion particle 7 used for a wavelength conversion member 70 is provided with a moth-eye structure section 74 having a fine concavo-convex structure in the side of a surface of a fluorescent particle 71, and the fine concavo-convex structure is formed in fluorescent particle 71 itself. Wavelength conversion member 70 is formed by dispersing wave-length conversion particle(s) 7 into a translucent medium 73 having a smaller refraction index than fluorescent particle 71 of wavelength conver-sion particle 7. Wavelength conversion member 70 is further provided with an antireflection section 76 in the side of the surface of fluorescent particle 71. Antireflection section 76 comprises moth-eye structure section 74 and translucent medium 73 entered between taper-shaped fine projections 75 of moth-eye structure section 74. In a light emitting device 1, wavelength conversion member 70 is used as a color conversion member converting a part of light emitted from a LED chip 10 into light having a longer wave-length than the light emitted from LED chip 10 and emitting the converted light.

11 Claims, 7 Drawing Sheets

(56) References Cited

U.S. PATENT DOCUMENTS

| | | |
|---|---|---|
| 2002/0043926 A1* | 4/2002 | Takahashi et al. ............ 313/503 |
| 2003/0168669 A1 | 9/2003 | Chua |
| 2007/0278935 A1 | 12/2007 | Harada |
| 2007/0280624 A1 | 12/2007 | Negley et al. |

FOREIGN PATENT DOCUMENTS

| | | | |
|---|---|---|---|
| JP | 2006100730 A | * | 4/2006 |
| JP | 2007-126536 A | | 5/2007 |
| JP | 2007-324475 A | | 12/2007 |

OTHER PUBLICATIONS

Form PCT/ISA/237 for corresponding International Application No. PCT/JP2010/066491 dated Oct. 19, 2010.

* cited by examiner

WAVELENGTH CONVERSION PARTICLE, WAVELENGTH CONVERSION MEMBER USING SAME, AND LIGHT EMITTING DEVICE

TECHNICAL FIELD

The invention relates to a wavelength conversion particle formed by using a fluorescent particle, a wavelength conversion member using same, and a light emitting device.

BACKGROUND ART

Previously, a LED lamp using a LED chip has been utilized in many fields, such as a signal lamp, a portable telephone, various electric spectaculars, an in-car indicator, various display systems and the like. Then, there has been a light emitting device formed by combining a LED chip and a fluorescent particle(s). The fluorescent particle(s) emits light excited by light emitted from the LED chip and thereby having a color different from the light emitted from the LED chip. Then, research and development of such a light emitting device have been worked in various places. As this kind of light emitting device, for example, a white light emitting device (generally, called a white LED) has been adopted on a commercial basis, and can obtain white light (emission spectrum of white light) by combining a LED chip and a fluorescent body, and then increasingly has been applied to a backlight of a liquid crystal display and a flash unit.

Then, recently, the white LED has been souped-up. So, research and development for utilizing the white LED for illumination purpose have been worked increasingly. The white LED has a long life and is mercury free, and thus has been expected as an environmentally-friendly alternative light source for a fluorescent lamp, by utilizing such an advantage.

As the above-mentioned white LED, for example, there has been a light emitting device (for example, see Japanese Patent Application Laid-Open No. 2007-324475), which is formed by combining a LED chip emitting blue light and a wavelength conversion member (a color conversion member). Here, the wavelength conversion member is formed by dispersing a wave-length conversion particle formed by using a fluorescent particle (a red fluorescent particle, a green fluorescent particle) into a translucent medium (a silicone resin, a glass and the like).

Here, the wavelength conversion member disclosed in the document is formed by using the fluorescent particle (red fluorescent particle, green fluorescent particle) covered by a translucent coated layer as the wavelength conversion particle, and the translucent coated layer is formed of a material having a refraction index midway between refraction indexes of the fluore-scent particle and the translucent medium. Then, the wavelength conver-sion member can improve incident efficiency of light emitted from the LED chip incident upon the fluorescent particle (incident efficiency of exciting light incident upon the fluorescent particle) and efficiency for extracting conversion light from the fluorescent particle.

Figure 8A:
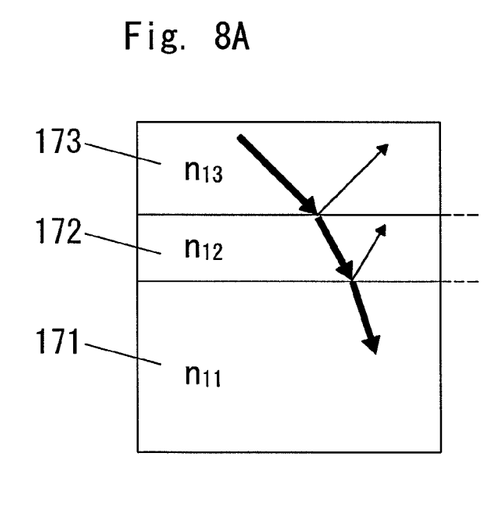
FIG. 8A is an explanation drawing for explaining a main section of a conventional wavelength conversion member.
Figure 8B:
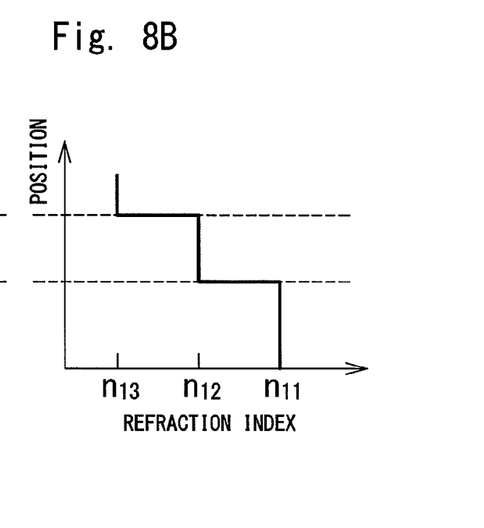
FIG. 8B is an explanation drawing for explaining said main section of said conventional wavelength conversion member.

However, as shown in FIG. 8A, in the wavelength conversion member described in the above document, when a refraction index of a fluorescent particle 171 is denoted by n11 and a refraction index of a translucent medium 173 is denoted by n13 and a refraction index of a translucent coated layer 172 is denoted by n12, n13<n12<n11 is satisfied. Then, as shown in FIG. 8B, these refraction indexes change in stages with respect to a normal direction of a surface of fluorescent particle 171. In this wavelength conversion member, in regard to a part of exciting light emitted from the LED chip, Fresnel reflection occurs at an interface between translucent medium 173 and translucent coated layer 172, and at an interface between translucent coated layer 172 and fluorescent particle 171. Thus, it is expected that the incident efficiency of the exciting light incident upon fluorescent particle 171 is further improved. Then, in the wavelength conversion member, refraction index n12 of translucent coated layer 172 is set to be smaller than refraction index n11 of fluorescent particle 171. As a result, in regard to the conversion light from fluorescent particle 171, total reflection occurs at an interface between translucent coated layer 172 and fluorescent particle 171 and, that is, there is an angle of total reflection. Accordingly, it is expected that the efficiency for extracting the conversion light from fluorescent particle 171 is further improved.

DISCLOSURE OF THE INVENTION

It is an object of the present invention to provide a wavelength conve-rsion particle, a wavelength conversion member using the same, and a light emitting device, which can further improve incident efficiency of exciting light incident upon a fluorescent particle and efficiency for extracting conve-rsion light from the fluorescent particle.

A wavelength conversion particle of the present invention is formed by using a fluorescent particle and absorbs incident exciting light and then emits light having a longer wavelength than the incident exciting light. According to a first aspect of the present invention, said wavelength conversion particle is provided with a moth-eye structure section having a fine concavo-convex structure in the side of a surface of said fluorescent particle, and said fine concavo-convex structure is formed in said fluorescent particle itself.

In this configuration, because said wavelength conversion particle is provided with a moth-eye structure section having a fine concavo-convex structure in the side of a surface of said fluorescent particle and said fine concavo-convex structure is formed in said fluorescent particle itself, said wavelength conversion particle prevents Fresnel reflection and thereby can further improve incident efficiency of the exciting light incident upon said fluorescent particle and efficiency for extracting conversion light from said fluorescent particle.

In one embodiment, preferably, the wavelength conversion particle is further formed with a translucent metal-oxide layer in the side of the surface of said fluorescent particle.

In this configuration, said translucent metal-oxide layer functions as a barrier layer preventing extraneous moisture from reaching said fluore-scent particle. Thus, moisture resistance can be improved (said metal-oxide layer can prevent that properties of said fluorescent particle deteriorate due to the moisture influence), and then the wavelength conversion particle can increase freedom to choose materials of said fluorescent particle.

According to a second aspect of the present invention, a wavelength conversion particle is formed by using a fluorescent particle and absorbs incident exciting light and emits light having a longer wavelength than the incident exciting light and is provided with a moth-eye structure section having a fine concavo-convex structure in the side of a surface of said fluorescent particle and said fine concavo-convex structure is formed in said fluorescent particle itself, and then a wavelength conversion member is formed by dispersing said wavelength conversion particle into a translucent medium having a smaller refraction index than said fluorescent particle. Then, said wavelength conversion member is provided with an antireflection section in the side of the surface of said fluorescent particle, and said antireflection section comprises said moth-eye structure section and said translucent medium entered between taper-shaped fine projections of said moth-eye structure section.

In this configuration, the wavelength conversion member is provided with an antireflection section in the side of the surface of said fluorescent particle, and then said antireflection section comprises said moth-eye structure section and said translucent medium entered between taper-shaped fine projections of said moth-eye structure section, and then each fine projection of said moth-eye structure section is formed in said fluorescent particle itself. As a result, in a thickness direction of said antireflection section, an effective refraction index of said antireflection section changes continuously between refraction indexes of said fluorescent particle and said translucent medium. Thus, the wavelength conversion member can further improve incident efficiency of the exciting light incident upon said fluorescent particle and efficiency for extracting conversion light from said fluorescent particle.

According to a third aspect of the present invention, a wavelength conversion particle is formed by using a fluorescent particle and absorbs incident exciting light and emits light having a longer wavelength than the incident exciting light and is provided with a moth-eye structure section having a fine concavo-convex structure in the side of a surface of said fluorescent particle and said fine concavo-convex structure is formed in said fluorescent particle itself, and then a wavelength conversion member is formed by dispersing said wavelength conversion particle, formed with a translucent metal-oxide layer, into a translucent medium having a smaller refraction index than said fluorescent particle, and said translucent medium further has approximately the same refraction index as said metal-oxide layer. Then, said wavelength conversion member is provided with an antireflection section in the side of the surface of said fluorescent particle, and said antireflection section comprises said moth-eye structure section and said metal-oxide layer entered between taper-shaped fine projections of said moth-eye structure section.

In this configuration, the wavelength conversion member is provided with an antireflection section in the side of the surface of said fluorescent particle, and said antireflection section comprises said moth-eye structure section and said metal-oxide layer entered between taper-shaped fine projections of said moth-eye structure section, and then each fine projection of said moth-eye structure section is formed in said fluorescent particle itself. As a result, in a thickness direction of said antireflection section, an effective refraction index of said antireflection section changes continuously between refraction indexes of said fluorescent particle and said translucent medium. Accordingly, the wavelength conversion member can further improve incident efficiency of the exciting light incident upon said fluorescent particle and efficiency for extracting conversion light from said fluorescent particle. In addition, because said translucent medium has approximately the same refraction index as said metal-oxide layer, the wavelength conversion member can improve moisture resistance, and can prevent a reduction in antireflection effect of said moth-eye structure section and can prevent reflection of exciting light.

In one embodiment, preferably, said translucent medium is a silicone resin or a glass.

In this configuration, when general blue light or ultraviolet light is used as exciting light of said fluorescent particle, the wavelength conversion member can prevent that said translucent medium deteriorates duet to the exciting light.

According to a fourth aspect of the present invention, a light emitting device comprises a LED chip and a color conversion member which converts a part of light emitted from said LED chip into light having a longer wave-length than the light emitted from said LED chip and emits the converted light. Then, said wavelength conversion member is used as said color conversion member.

In this configuration, said wavelength conversion member is used as said color conversion member which converts a part of light emitted from said LED chip into light having a longer wavelength than the light emitted from said LED chip and emits the converted light. Accordingly, the light emitting device can further improve incident efficiency of exciting light incident upon said fluorescent particle and efficiency for extracting conversion light from said fluorescent particle in said color conversion member, and thus can provide higher light output.

BRIEF DESCRIPTION OF THE DRAWINGS

Preferred embodiments of the invention will now be described in further details. Other features and advantages of the present invention will become better understood with regard to the following detailed description and accompanying drawings where.

BEST MODE FOR CARRYING OUT THE INVENTION

Embodiment 1

Figure 1A:
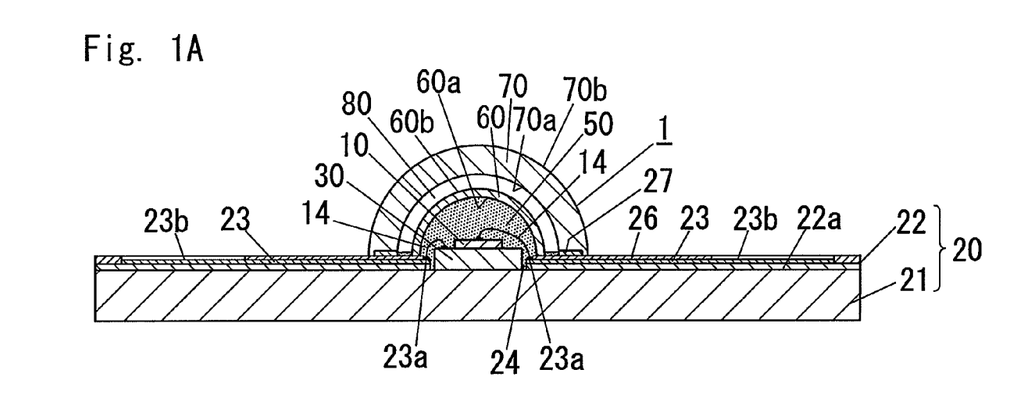
FIG. 1A is a schematic cross-sectional view showing a light emitting device using a wavelength conversion member according to Embodiment 1 of the present invention.
Figure 2:
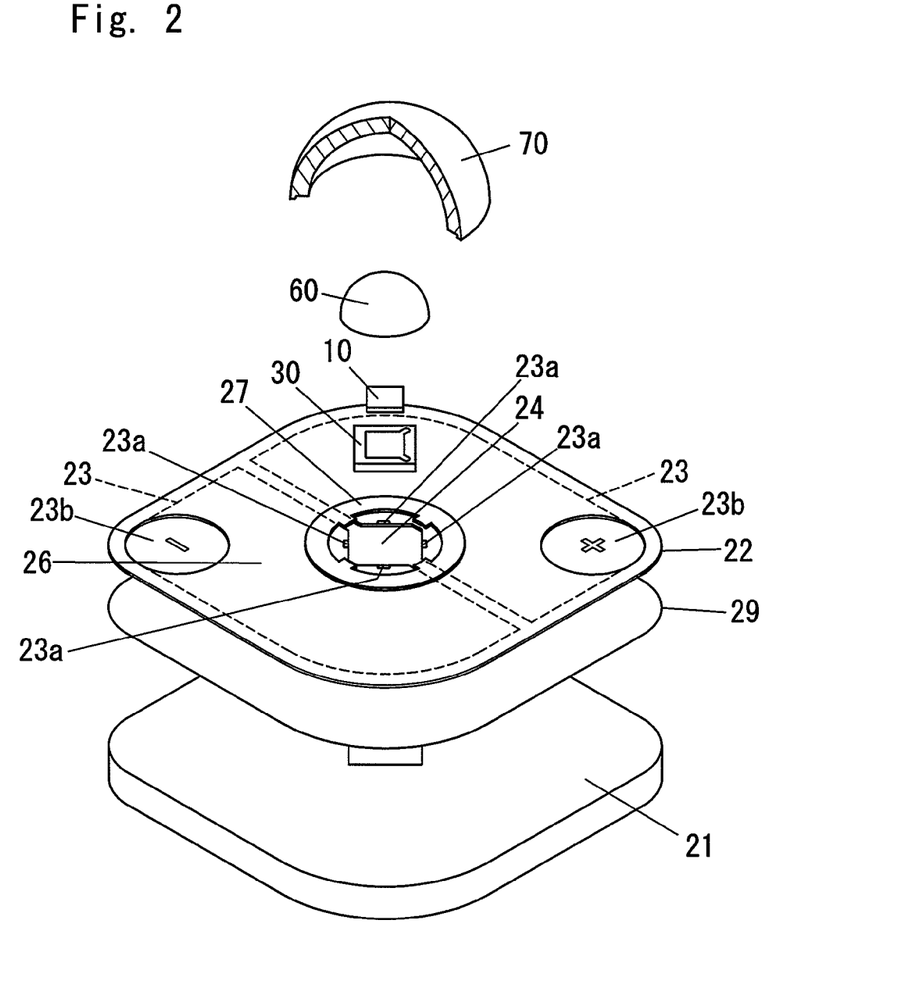
FIG. 2 is a schematic exploded perspective view showing said light emitting device according to said Embodiment 1 of the present invention.

In the present embodiment, a light emitting device 1 comprises a LED chip 10 and a wavelength conversion member 70, as shown in FIGS. 1A and 2. Hereinafter, a wavelength conversion particle 7 formed by using a fluorescent particle 71 and a wavelength conversion member 70 using the same will be explained, after the explanation of light emitting device 1.

A light emitting device 1 of the present embodiment comprises a LED chip 10 and a mounted substrate 20, which is formed into a rectangular plate and is provided in the side of its one surface with conductor patterns 23, 23 for supplying power to LED chip 10, and then LED chip 10 is mounted on the side of said one surface of mounted substrate 20. Additionally, light emitting device 1 comprises an optical element 60, which is formed of a translucent material into a dome-shape and controls distribution of light emitted from LED chip 10. Optical element 60 is secured to the side of said one surface of mounted substrate 20 so that LED chip 10 is stored between optical element 60 and mounted substrate 20. Additionally, light emitting device 1 comprises a plurality of bonding wires 14 (two wires in the present embodiment), formed of thin metallic wires (for example, gold thin wires, aluminum thin wires and the like) electrically connected to LED chip 10. Additionally, light emitting device 1 comprises a sealing section 50, which is formed of a translucent encapsulation material and is injected into a space enclosed by optical element 60 and mounted substrate 20 and thereby seals LED chip 10 and bonding wires 14. Furthermore, light emitting device 1 comprises a wavelength conversion member (a color conversion member) 70, which is formed by dispersing a fluorescent particle(s) 71 (see FIG. 1B) into a translucent medium 73 (see FIG. 1B). Then, fluorescent particle(s) 71 emits light (conversion light having a color different from light emitted from LED chip 10), which is excited by light (exciting light) emitted from LED chip 10 and has a longer wavelength than the exciting light. Wavelength conve-rsion member 70 is formed into a dome-shape, and is located on the side of said one surface of mounted substrate 20 so that LED chip 10 and the like are stored between the member 70 and mounted substrate 20. Here, a gas space (for instance an air space and the like) 80 is formed between optical element 60 and wavelength conversion member 70. Here, a ring-shaped weir section 27 is projected in the outside of optical element 60 on the side of said one surface of mounted substrate 20, and can hold back the overspill of an encapsulation resin from said space when optical element 60 is secured to mounted substrate 20.

LED chip 10 is a blue GaN-based LED chip emitting blue light, and an n-type SiC substrate is used as a substrate for crystal growth. The n-type SiC substrate has a lattice constant and a crystal structure close to GaN compared with a sapphire substrate, and has a conductive property. Then, a light emitting part is formed of a GaN-based compound semiconducting material on the side of a main surface of the SiC substrate, and comprises a laminate structure having, for example, a double heterostructure, and then is grown through epitaxial growth method (for instance MOVPE method and the like), and thereby LED chip 10 is formed. Here, LED chip 10 is formed on the side of its one surface (its top surface in FIG. 1A) with an anode electrode (not shown), and is formed on the side of the other surface (its lower surface in FIG. 1A) with a cathode electrode (not shown). Each of the anode and cathode electrodes is formed of a laminated film comprising a Ni film and an Au film. Then, as long as good Ohmic features can be obtained, the materials of the cathode and anode electrodes are not limited into particular materials, and then, for example, Al and the like may be used as the materials. Then, the structure of LED chip 10 is not limited into a particular structure. For example, after said light emitting part and the like are grown on the side of the main surface of said substrate for crystal growth through the epitaxial growth method, a support substrate (for instance Si substrate and the like) for supporting said light emitting part is secured to said light emitting part and then said substrate for crystal growth is removed, and thereby LED chip 10 may be obtained.

Mounted substrate 20 comprises a rectangular-shaped heat exchanger plate 21 which is formed of a heat-conductive material and on which LED chip 10 is mounted, and a wiring substrate 22 which is a rectangular-shaped flexible wiring substrate and is fixed to the side of one surface (a top surface in FIG. 1A) of heat exchanger plate 21 through a fixing sheet 29 of, for example, polyolefin series (see FIG. 2). Mounted substrate 20 is formed with a rectangular-shaped window hole 24 exposing a mounting surface (a part of said one surface) of heat exchanger plate 21 on which LED chip 10 is mounted, on a center part of wiring substrate 22. Then, in mounted substrate 20, LED chip 10 is mounted on heat exchanger plate 21 through a submount member 30 located inside window hole 24 and described below. Accordingly, heat occurred at LED chip 10 is transferred to submount member 30 and heat exchanger plate 21 without being transferred to wiring substrate 22.

Wiring substrate 22 is provided with a pair of conductor patterns 23, 23 for supplying power to LED chip 10, on the side of one surface of an insulating base material 22a formed of a polyimide film. Then, a protection layer 26 is formed of a resist (a resin) of white color series, and is laminated on wiring substrate 22, and then covers a part of insulating base material 22a on which conductor patterns 23, 23 are not formed. Therefore, in light emitting device 1, when light emitted from a lateral side of LED chip 10 is incident upon a surface of protection layer 26, the light is reflected by the surface of protection layer 26. Thus, light emitting device 1 can prevent light emitted from LED chip 10 from being absorbed by wiring substrate 22, and can provide higher light output with respect to efficiency for extracting light to the outside. In addition, an outer periphery shape of each of conductor patterns 23, 23 is set to be slightly smaller than half of an outer periphery shape of insulating base material 22a.

Then, a glass-cloth epoxy resin (FR4 FR5), a paper phenol, and the like, may be used as a material of insulating base material 22a.

Protection layer 26 is patterned so that two points of each of conductor patterns 23, 23 are exposed near window hole 24 of wiring substrate 22 and one point of each of conductor patterns 23, 23 is exposed in a periphery of wiring substrate 22. Here, each of conductor patterns 23, 23 comprises two terminal areas 23a which are said two points formed into rectangular shapes and connected to bonding wires 14 and exposed near window hole 24 of wiring substrate 22, and further comprises an electrode section 23b for external connection which is said one point formed into a circular shape and exposed in the periphery of wiring substrate 22. In addition, each of condu-ctor patterns 23, 23 of wiring substrate 22 is formed of a laminated film comprising a Cu film, a Ni film and an Au film.

Incidentally, LED chip 10 is mounted on heat exchanger plate 21 through submount member 30 which absorbs a stress acting to LED chip 10 due to a difference between linear expansion coefficients of LED chip 10 and heat exchanger plate 21. Here, submount member 30 is formed into a rectangular shape, and its size is set to be larger than the size of LED chip 10.

Submount member 30 has not only a function absorbing said stress but also a function transferring heat occurred at LED chip 10 to a broader range than the size of LED chip 10 in heat exchanger plate 21. Accordingly, light emitting device 1 of the present embodiment can absorbs said stress acting to LED chip 10 due to a difference between linear expansion coefficients of LED chip 10 and heat exchanger plate 21. Furthermore, since LED chip 10 is mounted on heat exchanger plate 21 through submount member 30, light emitting device 1 can efficiently release the heat occurred at LED chip 10 through submount member 30 and heat exchanger plate 21.

AlN having insulation properties and relatively-high heat conductivity is used as a material of submount member 30. Then, the above-mentioned cathode electrode of LED chip 10 is electrically connected to one conductor pattern 23 through bonding wire 14 and an electrode pattern (not shown) located in a surface of submount member 30 on which LED chip 10 is mounted. Then, the above-mentioned anode electrode of LED chip 10 is electrically connected to the other conductor pattern 23 through bonding wire 14. Then, LED chip 10 and submount member 30 may be jointed to each other by using a silver paste or a solder such as SnPb, AuSn and SnAgCu, and preferably by using a Pb-free solder such as AuSn and SnAgCu. When the material of submount member 30 is Cu and these are jointed to each other by using AuSn, it is necessary that metallic layers of Au or Ag are previously formed in joint surfaces of LED chip 10 and submount member 30 as preprocessing. Then, preferably, submount member 30 and heat exchanger plate 21 are jointed to each other by using a Pb-free solder such as AuSn and SnAgCu. Here, when these are jointed by using AuSn, it is necessary that a metallic layer of Au or Ag is previously formed in a joint surface of heat exchanger plate 21 as preprocessing.

Then, as long as the material of submount member 30 has linear expansion coefficient which is relatively close to 6H—SiC being a material of the substrate for crystal growth and relatively-high heat conductivity, the material of submount member 30 is not limited to AlN. For example, SiC composite material, Si, Cu, CuW and the like may be used as the material of submount member 30. In addition, in light emitting device 1, since submount member 30 has the above-mentioned function transferring heat, it is desirable that a surface area of heat exchanger plate 21 in the side of LED chip 10 is sufficiently larger than a surface area of LED chip 10 in the side of heat exchanger plate 21.

Then, in light emitting device 1 of the present embodiment, a thickness of submount member 30 is set so that a distance of a top surface of submount member 30 to heat exchanger plate 21 is more than a distance of a top surface of protection layer 26 in wiring substrate 22 to heat exchanger plate 21. Accordingly, light emitting device 1 can prevent light emitted laterally from LED chip 10 from being absorbed by wiring substrate 22 through an inner periphery of window hole 24 in wiring substrate 22. Then, preferably, submount member 30 is formed with a reflection coating for reflecting light emitted from LED chip 10 around a joint part in its surface to which LED chip 10 is jointed. Thereby, light emitting device 1 can prevent light emitted from the lateral side of LED chip 10 from being absorbed by submount member 30, and can further improve efficiency for extracting light to the outside. Here, the reflection coating may be formed of, for example, a laminated film comprising a Ni film and an Ag film.

A silicone resin is used as a seal material of the above-mentioned sealing section 50. However, the seal material is not limited to the silicone resin. For example, a glass and the like may be used as the seal material. Then, in addition to Si, a particle/resin composite (nano-composite) including other metallic composition such as Ti, Zr, Al, Y and Ge, for example, a metal-oxide nanoparticle in a silicone resin, or a silicone resin hybrid material including said metallic composition in a framework of a resin may be used as the seal material. Furthermore, other than said metallic composition, a silicone resin hybrid material being a composite of a silicone resin component and a resin component such as olefin may be used. Then, when a glass is used as the seal material, its refraction index and melting point may be adjusted by adding a metallic element such as Ti, Zr, Al, Y and Ge, and then the adjusted glass material may be used.

Optical element 60 is a dome-shaped molded component of a trans-lucent material (such as a silicone resin, a glass). Here, if optical element 60 is a molded component of a silicone resin, a difference between refraction indexes of optical element 60 and sealing section 50 and a difference between linear expansion coefficients thereof can be reduced.

Then, in optical element 60, a light exit surface 60b is formed into a convex curve shape so that total reflection does not occur at an interface between light exit surface 60b and gas space 80 with respect to light entered from a light entrance surface 60a. Then, optical element 60 is located so that LED chip 10 coincides with an optical axis. Therefore, in light emitting device 1, when light emitted from LED chip 10 enters light entrance surface 60a of optical element 60, the total reflection does not occur at the interface between light exit surface 60b and gas space 80 and then the light easily reaches wavelength conversion member 70, and thus light emitting device 1 can increase total luminous flux. In addition, optical element 60 is formed so that its thickness in a normal direction is constant with position.

Wavelength conversion member 70 is formed by dispersing wave-length conversion particle(s) 7 formed by using fluorescent particle(s) 71 into a translucent medium (for instance a silicone resin and the like) 73 having a smaller refraction index than fluorescent particle 71 of wavelength conve-rsion particle 7 (that is, wavelength conversion particles 7 are scattered within translucent medium 73). Then, red fluorescent particles and green fluorescent particles are used as fluorescent particles 71. Accordingly, blue light is emitted from LED chip 10 and red light and green light are emitted from the red and green fluorescent particles in wavelength conversion member 70, respectively, and then, these lights are emitted through a light exit surface (an external surface) 70b of wavelength conversion member 70, and thereby white light can be provided.

Instead of using the red and green fluorescent particles, for example, yellow fluorescent particles may be used as fluorescent particles 71 in wavelength conversion member 70. Or green and orange fluorescent particles may be used, or yellow-green and orange fluorescent particles may be used. Instead of using a blue LED chip emitting blue light as LED chip 10, a UV LED chip emitting ultraviolet light may be used and then red, green and blue fluorescent particles may be used as fluorescent particles 71, and thereby white light may be provided.

Then, translucent medium 73 used as a material of wavelength conversion member 70 is not limited to a silicone resin, and then may be other resin (for instance an epoxy resin and the like) or a glass. However, when general blue light or ultraviolet light is used as exciting light, use of a silicone resin or a glass can prevent that translucent medium 73 deteriorates due to the exciting light Translucent medium 73 is not limited to a general silicone resin or glass. Then, in addition to Si, a particle/resin composite (nano-composite) including other metallic composition such as Ti, Zr, Al, Y and Ge, for example, a metal-oxide nanoparticle in a silicone resin, or a silicone resin hybrid material including said metallic composition mixed or bonded at a molecular scale may be used as translucent medium 73. Furthermore, other than said metallic composition, a silicone resin hybrid material being a composite of a silicone resin component and a resin compo-nent such as olefin may be used. Other than said silicone resin nano-composite and silicone resin hybrid, an organic/inorganic hybrid material or a nano-composite material including an organic component and an inorganic component mixed or bonded at a nanometer scale or at a molecular scale may be used. Then, when a glass is used as translucent medium 73, its refraction index and melting point may be adjusted by adding a metallic element such as Ti, Zr, Al, Y and Ge, and then the adjusted glass material may be used.

Then, a light entrance surface (an interior surface) 70a of wavelength conversion member 70 is formed into a shape along light exit surface 60b of optical element 60. Accordingly, a distance between wavelength conversion member 70 and light exit surface 60b of optical element 60 in a normal direction is almost constant with position in light exit surface 60b of optical element 60. Then, wavelength conversion member 70 is formed so that its thickness in a normal direction is constant with position. Then, an end edge (a periphery of an opening section) of wavelength conversion member 70 in the side of mounted substrate 20 may be secured to mounted substrate 20 by using an adhesion bond (for instance a silicone resin, an epoxy resin and the like).

Figure 1B:
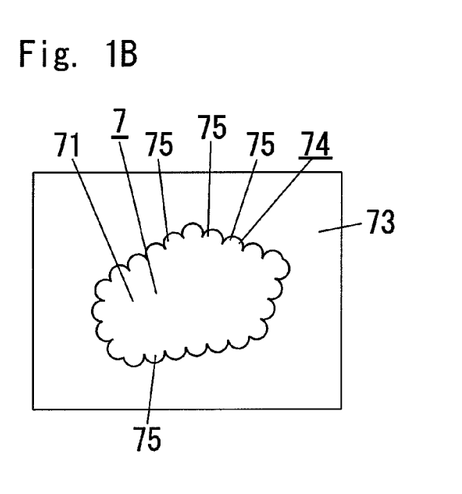
FIG. 1B is an explanation drawing for explaining a main section of said wavelength conversion member according to said Embodiment 1 of the present invention.
Figure 1C:
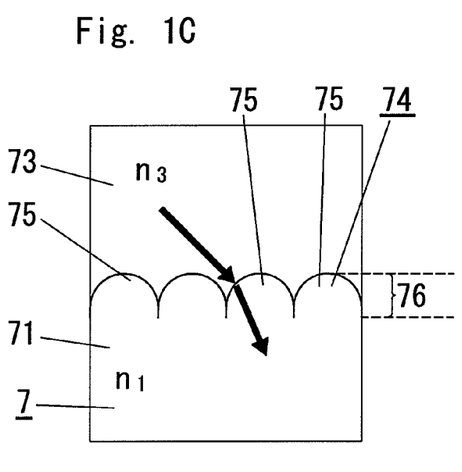
FIG. 1C is an explanation drawing for explaining said main section of said wavelength conversion member according to said Embodiment 1 of the present invention.

Incidentally, as shown in FIGS. 1B and 1C, wavelength conversion member 70 of the present embodiment is provided with an antireflection section 76 in the side of a surface of each fluorescent particle 71. Then, antireflection section 76 comprises a moth-eye structure section 74 having a fine concavo-convex structure, and a translucent medium 73 entered between taper-shaped fine projections 75 of moth-eye structure section 74. Then, the fine concavo-convex structure of moth-eye structure section 74 is formed in a fluorescent particle 71 itself (that is, each fine projection 75 of moth-eye structure section 74. is formed in a fluorescent particle 71 itself.

Figure 4A:
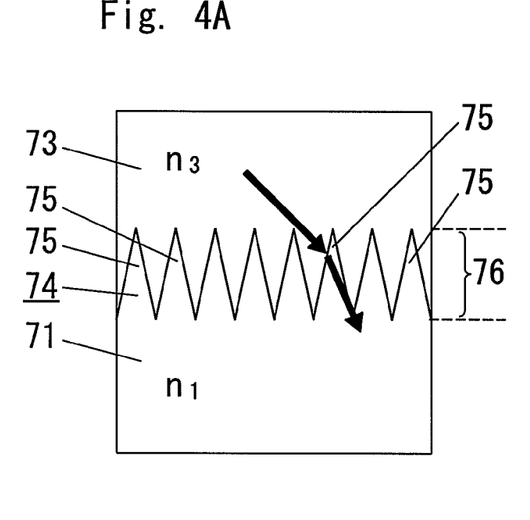
FIG. 4A is an explanation drawing for explaining a main section of an ideal wavelength conversion member according to said Embodiment 1 of the present invention.

Here, the method of forming moth-eye structure section 74 having the fine concavo-convex structure in a surface of each fluorescent particle 71 is not limited to a particular method. As the method of the formation, chemical etching, thermal treatment, hydrothermal treatment, plasma etching and the like are cited. Then, a surface of each fluorescent particle 71 is etched by using, for example, a liquid solution of acid series (such as a nitric acid aqueous solution, a hydrofluoric acid aqueous solution), and thereby many fine projections 75 are formed in each fluorescent particle 71. Then, shapes and sizes of fine projections 75 can be controlled through proper configuration of types, concentration, temperature, etching time and the like of the liquid solution of acid series. Thus, fine projections 75 can be formed into, for example, hemispherical shapes as shown in FIG. 1B, or can be formed into drill shapes as shown in FIG. 4A explained below. Then, in regard to the sizes of fine projections 75, a distance between two adjacent fine projections 75, a transverse width of each fine projection 75 and a projecting size (height) of each fine projection 75 can be controlled.

The method of forming moth-eye structure section 74 having the fine concavo-convex structure in a surface of each fluorescent particle 71 is not limited to a wet etching method using a liquid solution of acid series and the like described above. As the method, a dry etching method such as thermal treatment, hydrothermal treatment, treatment of exposing to gas such as ammonia gas or hydrochloric gas, plasma etching (plasma gas etching) and the like may be used. Here, when moth-eye structure section 74 is formed in a surface of each fluorescent particle 71 by using the plasma etching, a surface of each fluorescent particle 71 in suspension may be bombarded with Ar ions, and thereby sputtering may be performed (that is, a surface of each fluorescent particle 71 may be etched physically).

Figure 3A:
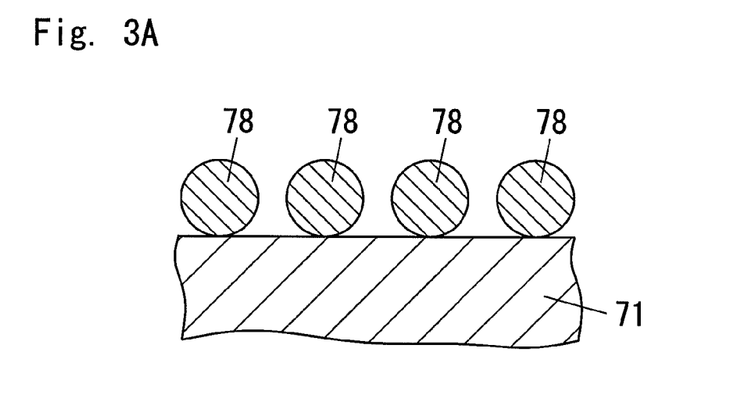
FIG. 3A is an explanation drawing for explaining a method for manufacturing a wavelength conversion particle according to said Embodiment 1 of the present invention.
Figure 3B:
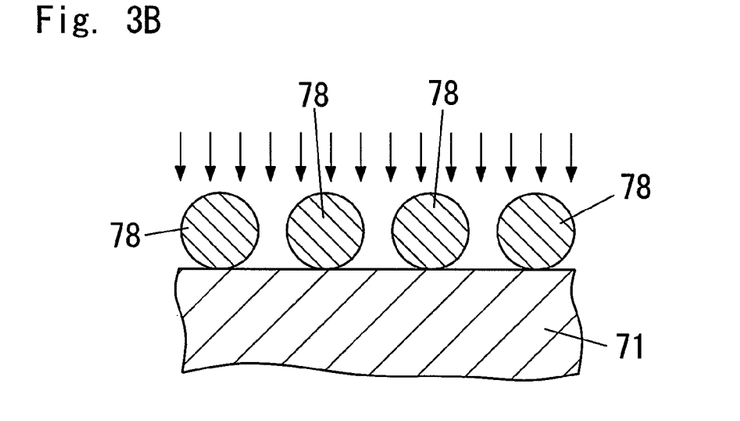
FIG. 3B is an explanation drawing for explaining said method for manufacturing said wavelength conversion particle according to said Embodiment 1 of the present invention.
Figure 3C:
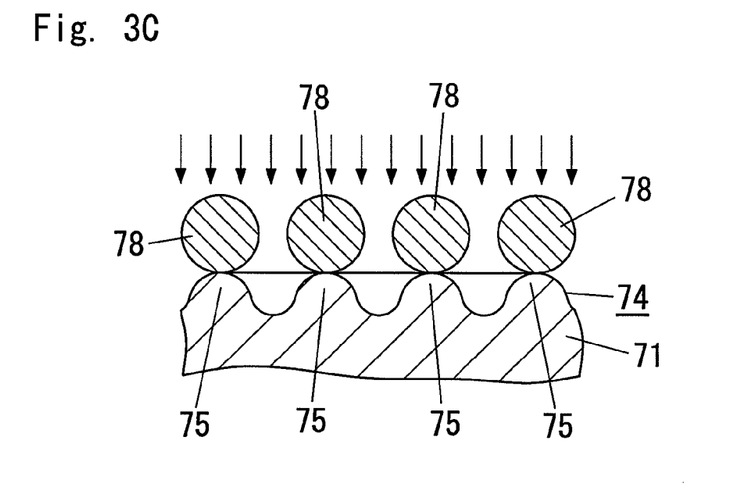
FIG. 3C is an explanation drawing for explaining said method for manufacturing said wavelength conversion particle according to said Embodiment 1 of the present invention.

Then, before etching is performed, a surface of each fluorescent particle 71 may be previously masked partially by many fine particles 78, each of which has a smaller particle diameter (a mean particle diameter) than each fluorescent particle 71 as shown in FIG. 3A. Then, after etching is performed as shown in FIG. 3C, these fine particles 78 may be removed by washing and the like. In addition, FIG. 3C shows an example of a shape of moth-eye structure section 74 formed in a surface of each fluorescent particle 71 when reactive ion etching is performed to fluorescent particles 71 by utilizing plasma of reactive gas (such as CF4 gas, CH4 gas, CF6 gas, NH3 gas, Cl2 gas, H2 gas, CO gas and the like). Then, FIG. 3B is an explanation drawing at the start of the reactive ion etching, and arrows in FIGS. 3B and 3C show traveling directions of reactive ions schematically.

For example, if many fine particles 78, each of which has a particle diameter of 50 nm, are attached to a surface of each fluorescent particle 71 and then fluorescent particles 71 are etched by utilizing fine particles 78 as masking, fine projections 75, each of which has a transverse width (a transverse width of a convex portion) of 50 nm, can be produced. Then, when a distance between centers of two adjacent fine particles 78 is for instance 200 nm, a distance (a transverse width of a concave portion) between two adjacent fine projections 75 can be set to 150 nm=200−(25+25).

In order to mask a surface of each fluorescent particle 71 partially by using many fine particles 78, fluorescent particles 71 (for example, fluores-cent particles have mean particle diameters of 15 μm and its composition is (Ba,Sr)2SiO4: Eu2+) are added to an alcohol dispersion liquid including fine particles 78 comprising, for instance, nanoparticles (monodisperse spherical alumina nanoparticles having means particle diameters of 50 nm), and then are agitated and dispersed. Thereby, fine particles 78 can be attached to a surface of each fluorescent particle 71. Here, the amount of fine particles 78 attached to the surface of each fluorescent particle 71 can be changed by adjusting concentration of fine particles 78 in the alcohol dispersion liquid. Then, the amount can be controlled continuously from the state where a whole surface of each fluorescent particle 71 is masked by fine particles 78 (the state where a masking rate of a surface of each fluorescent particle 71 is 100%) to the state where a surface of each fluorescent particle 71 is masked by none of fine particles 78 (the state where a masking rate of a surface of each fluorescent particle 71 is 0%). In this case, if surfaces of fluorescent particles 71 having mean particle diameters of 15 μm are masked by fine particles 78 having mean particle diameters of 50 nm at the masking rate of 11%, an average distance between centers of two adjacent fine particles 78 becomes about 200 nm.

In moth-eye structure section 74, a projecting size of each fine projection 75 and a distance (a pitch) between two adjacent fine projections 75 require to be set to less than or equal to $\lambda/n3$, when a wavelength of exciting light is denoted by "$\lambda$" and a refraction index of translucent medium 73 is denoted by "n3". Accordingly, when for example fine projections 75 in moth-eye structure section 74 are formed into hemispherical shapes as shown in FIG. 1B and exciting light is blue light having a wavelength $\lambda$ of 480 nm and translucent medium 73 is a silicone resin and has a refraction index n3 of 1.4, said projecting size and said distance require to be set to less than or equal to 343 nm≈480/1.4. When $\lambda$=350 nm, said projecting size and said distance require to be set to less than or equal to 250 nm≈350/1.4. Here, when n3=1.4 and the wavelength $\lambda$ has, for example, a range of 350 nm to 480 nm, said projecting size and said distance require to be set to at least less than or equal to 343 nm≈480/1.4. Then, more preferably, a maximum size of said projecting size and a maximum distance (a maximum pitch) of said distance are set to 250 nm≈350/1.4 defined by a short wavelength $\lambda$=350 nm. In addition, in this case, most of fine projections 75 may have projecting sizes of less than or equal to 250 nm, and may be located at a pitch of, for example, 20 nm to 100 nm. Then, in regard to a surface roughness of fluorescent particle 71 formed with the fine concavo-convex structure, an arithmetic mean roughness "Ra" defined by JIS B 0601-2001 (ISO 4287-1997) may be less than or equal to 171.5 nm, and more preferably, less than or equal to 125 nm. Also, an average contour curve element length "RSm" may be less than or equal to 171.5 nm, and more preferably, less than or equal to 125 nm.

Then, when for example fine projections 75 in moth-eye structure section 74 are formed into drill shapes as shown in FIG. 4A and exciting light is blue light having a wavelength $\lambda$ of 480 nm and translucent medium 73 is a silicone resin and has a refraction index n3 of 1.4, a distance between two adjacent fine projections 75 requires to be set to less than or equal to 343 nm≈480/1.4. When $\lambda$=350 nm, said distance requires to be set to less than or equal to 250 nm≈350/1.4. Here, when n3=1.4 and the wavelength $\lambda$ has, for example, a range of 350 nm to 480 nm, said distance requires to be set to at least less than or equal to 343 nm≈480/1.4. Then, more preferably, a maximum distance (a maximum pitch) of said distance may be set to 250 nm≈350/1.4 defined by a short wavelength $\lambda$=350 nm. In addition, in this case, most of fine projections 75 may have projecting sizes of less than or equal to 250 nm, and may be located at a pitch of, for example, 20 nm to 100 nm.

Figure 4B:
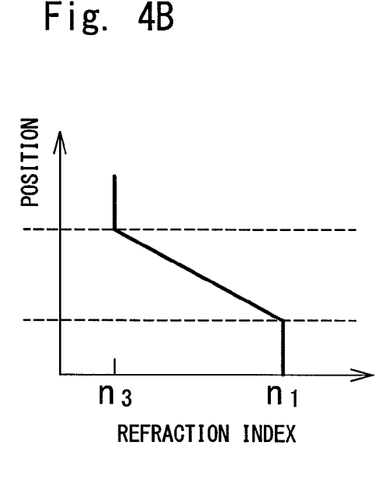
FIG. 4B is an explanation drawing for explaining said main section of said ideal wavelength conversion member according to said Embodiment 1 of the present invention.

Incidentally, in antireflection section 76 in the side of a surface of fluorescent particle 71, moth-eye structure section 74 has the fine concavo-convex structure comprising the arranged fine projections 75, each of which is formed into, for example, a drill shape, as shown in FIG. 4A. Here, when a refraction index of translucent medium 73 entered between fine projections 75, is denoted by "n3" and a refraction index of fluorescent particle 71 is denoted by "n1", since a refraction index of each fine projection 75 is the same as a refraction index of fluorescent particle 71, an effective refraction index of antireflection section 76 continuously changes between refraction index n1 of fluorescent particle 71 and refraction index n3 of translucent medium 73 in a thickness direction of antireflection section 76, as shown in FIG. 4B.

Figure 1D:
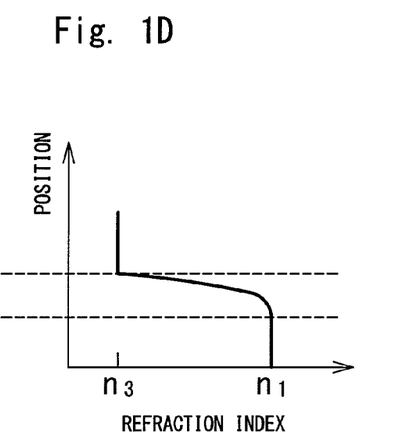
FIG. 1D is an explanation drawing for explaining said main section of said wavelength conversion member according to said Embodiment 1 of the present invention.

However, it is difficult to form moth-eye structure section 74 having the fine concavo-convex structure singly, as shown in FIG. 4A, in the side of a surface of fluorescent particle 71 (that is, to form almost all fine projections 75 into drill shapes). Therefore, in wavelength conversion member 70 of the present embodiment, the fine concavo-convex structure comprises fine projections 75 mostly formed into taper-shapes and arranged, as shown in FIGS. 1B and 1C. The effective refraction index of antireflection section 76 continuously changes between refraction index n1 of fluorescent particle 71 and refraction index n3 of translucent medium 73 in a thickness direction of antireflection section 76, as shown in FIG. 1D. In addition, when being formed through etching, moth-eye structure section 74 is formed so as to include both of the fine concavo-convex structure shown in FIG. 4A and the fine concavo-convex structure comprising fine projections 75 formed into taper-shapes and arranged shown in FIGS. 1B and 1C, depending on the etching condition. In this case, the effective refraction index of antireflection section 76 continuously changes between refraction index n1 of fluorescent particle 71 and refraction index n3 of translucent medium 73 in a thickness direction of antireflection section 76, and thus such a moth-eye structure section 74 is also effective.

Then, in regard to fluorescent particle 71 in wavelength conversion member 70, a fluorescent particle having a refraction index of 2.0 and a center particle diameter d50 of 10 μm is used as a red fluorescent particle, and its composition is expressed as CaAlSiN3:Eu2+. Then, a fluorescent particle having a refraction index of 1.9 and a center particle diameter d50 of 8 μm is used as a green fluorescent particle, and its composition is expressed as CaSc2O4:Ce3+. However, the fluorescent particles are not limited to these compositions. As the red fluorescent particle, the composition may be for instance (Ca,Sr)AlSiN3:Eu2+, CaS:Eu2+, (Ca,Sr)2Si5N8: Eu2+ and the like. As the green fluorescent particle, the composition may be for instance Ca3Sc2Si3O12:Ce3+, (Ca,Sr, Ba)Al2O4:Eu2+, SrGa2S4:Eu2+, and the like. Then, when a yellow fluorescent particle is used as fluorescent particle 71, the composition of the used particle may be for instance Y3Al5O12: Ce3+, (Ca,Sr,Ba,Zn)2SiO4:Eu2+ and the like. When yellow-green and orange fluorescent particles are used as fluorescent particles 71, the composition of the used yellow-green fluorescent particle may be for instance (Ba,Sr)2Si—O4:Eu2+ and the like. Then, the composition of the used orange fluorescent particle may be for instance Sr3SiO5: Eu2+, Ca0.7Sr0.3AlSiN3:Eu2+ and the like. In addition, the larger the fluorescent particle 71 has a center particle diameter d50, the less the defect density and energy loss are, and the higher the luminescent efficiency is. Thus, in view of the luminescent efficiency, preferably, a fluorescent particle having a center particle diameter d50 of more than or equal to 5 μm is used.

As explained above, wavelength conversion particle 7 in wavelength conversion member 70 of the present embodiment is formed by using fluorescent particle 71, and absorbs incident exciting light and then emits light having a longer wavelength than the incident exciting light. Then, wavelength conversion particle 7 is provided with moth-eye structure section 74 having the fine concavo-convex structure in the side of a surface of fluorescent particle 71. Then, the fine concavo-convex structure is formed in fluorescent particle 71 itself. Therefore, wavelength conversion particle 7 can prevent Fresnel reflection and thereby can further improve incident efficiency of the exciting light incident upon fluorescent particle 71 and efficiency for extracting conversion light from fluorescent particle 71.

Then, wavelength conversion member 70 of the present embodiment is formed by dispersing wavelength conversion particle(s) 7 into translucent medium 73 having a smaller refraction index than fluorescent particle 71 of wavelength conversion particle 7. Then, wavelength conversion member 70 is provided with antireflection section 76 in the side of a surface of fluorescent particle 71, and then antireflection section 76 comprises moth-eye structure section 74 and translucent medium 73 entered between taper-shaped fine projections 75 of moth-eye structure section 74. Thereby, in a thickness direction of antireflection section 76 (that is, a direction perpendicular to envelope curves of many fine projections 75, and specifically, a vertical direction in FIG. 1C), an effective refraction index of antireflection section 76 changes continuously between refraction index n1 of fluorescent particle 71 and refraction index n3 of translucent medium 73. Accordingly, wavelength conversion member 70 can further improve incident efficiency of the exciting light incident upon fluorescent particle 71 and efficiency for extracting conversion light from fluorescent particle 71.

Then, in light emitting device 1 of the present embodiment, wavelength conversion member 70 is used as the color conversion member converting a part of light emitted from LED chip 10 into light having a longer wavelength than the light emitted from LED chip 10, and emitting the converted light. As a result, light emitting device 1 can further improve incident efficiency of exciting light incident upon fluorescent particle 71 and efficiency for extracting conversion light from fluorescent particle 71 in the color conversion member, and thus can provide higher light output.

Practical Example 1

In this Practical Example 1, a blue LED chip having an emission peak wavelength of 460 nm was used as LED chip 10 of light emitting device 1 explained in Embodiment 1. Then, in regard to wavelength conversion member 70, a silicone resin having a refraction index of 1.4 was used as translucent medium 73. Then, in regard to fluorescent particle 71, a fluorescent particle having a refraction index of 1.9 and a center particle diameter d50 of 8 μm was used as a green fluorescent particle, and its composition is expressed as $CaSc_2O_4:Ce^{3+}$. Furthermore, a fluorescent particle having a refraction index of 2.0 and a center particle diameter d50 of 10 μm was used as a red fluorescent particle, and its composition is expressed as $CaAlSiN_3:Eu^{2+}$.

Here, in regard to green and red fluorescent particles, a predetermined amount of fluorescent particles 71 (a predetermined amount of green fluorescent particles or a predetermined amount of orange fluorescent particles) were dispersed into a pure water, when wavelength conversion particle 7 was formed in the manufacture of wavelength conversion member 70. Then, nitric acid was mixed with the water including fluorescent particles 71 and then the mixture was agitated. Then, slurry obtained by the agitation was filtered and washed, and thereby wavelength conversion particle 7 provided with moth-eye structure section 74 in the side of a surface of each fluorescent particle 71 was formed. Here, moth-eye structure section 74 had the fine concavo-convex structure having the arithmetic mean roughness Ra of 150 nm and the average contour curve element length RSm of 150 nm. After that a predetermined amount of wavelength conversion particles 7 were dispersed into a silicone resin having a refraction index of 1.4 and then the silicone resin including the particles 7 was formed into a dome-shape, and thereby wavelength conversion member 70 was formed, and then, light emitting device 1 was assembled. Then, as Comparative Example 1, a light emitting device was manufactured as well as Practical Example 1. However, moth-eye structure section 74 was not formed in each fluorescent particle 71 of the light emitting device of Comparative Example 1.

In Regard to Practical Example 1 and Comparative Example 1 explained above, an accelerated reliability test was performed under conditions of temperature of 85 degrees C., relative humidity of 85% RH and intermittent energization (a repetitive cycle of activating during 30 minutes and inactivating during 30 minutes). Then, the following Table 1 shows a total luminous flux measured before the start of the accelerated reliability test and a total luminous flux measured after 1000 hours had passed since the start of the test with respect to each Example 1. In addition, Table 1 shows relative values defined with reference to a total luminous flux of Comparative Example 1 measured before the start of the test as 100.

TABLE 1

|  | AFTER 0 HOUR (BEFORE START OF TEST) | AFTER 1000 HOURS |
|---|---|---|
| COMPARATIVE EXAMPLE 1 | 100 | 32 |
| PRACTICAL EXAMPLE 1 | 115 | 75 |

In Table 1, it is found that the total luminous flux before the start of the test in light emitting device 1 of Practical Example 1 is increased by 15% compared to that in the light emitting device of Comparative Example 1. Then, it is found that the total luminous flux after 1000 hours in Practical Example 1 does not deteriorate much compared that in Comparative Exam-ple 1 and light emitting device 1 of Practical Example 1 can provide higher light output than a light emitting device of Comparative Example 1.

Embodiment 2

Incidentally, although light emitting device 1 explained in Practical Example 1 can provide higher light output, the luminous flux measured after 1000 hours had passed since the start of the accelerated reliability test is smaller than the luminous flux measured before the start of the test. That is thought that fluorescent particles 71 of wavelength conversion particles 7 in wavelength conversion member 70 absorbs moisture from outside and thus properties of wavelength conversion particles 7 are decreased.

Figure 5A:
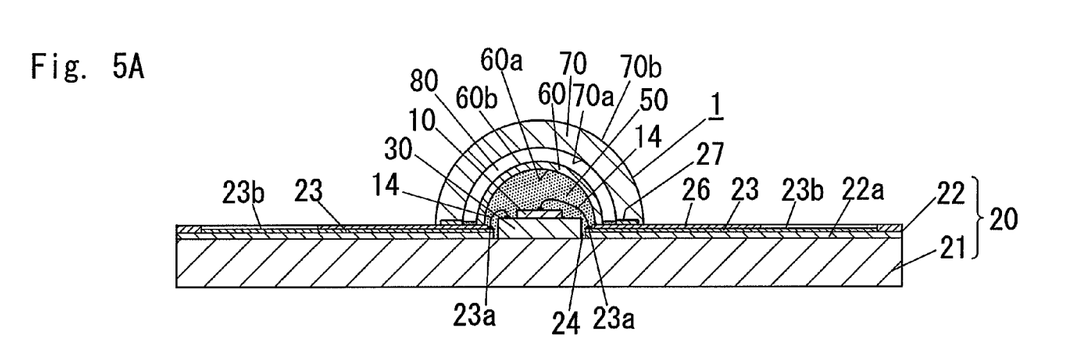
FIG. 5A is a schematic cross-sectional view showing a light emitting device using a wavelength conversion member according to Embodiment 2 of the present invention.
Figure 5B:
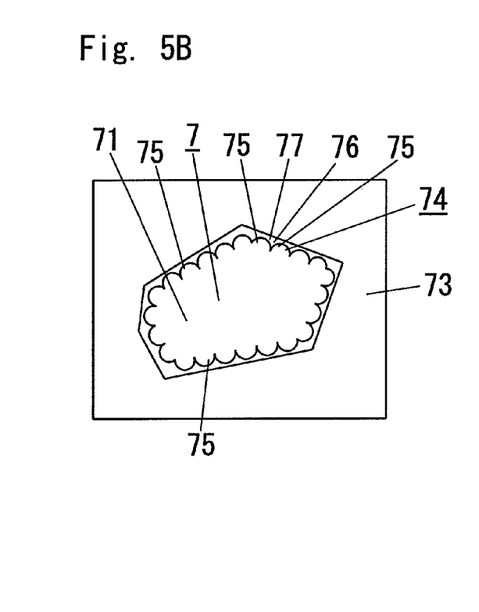
FIG. 5B is an explanation drawing for explaining a main section of said wavelength conversion member according to said Embodiment 2 of the present invention.
Figure 5C:
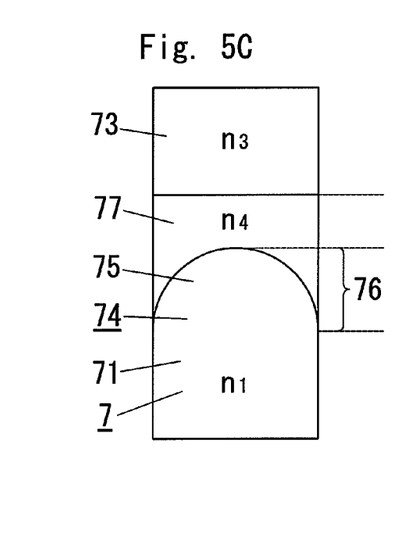
FIG. 5C is an explanation drawing for explaining said main section of said wavelength conversion member according to said Embodiment 2 of the present invention.
Figure 5D:
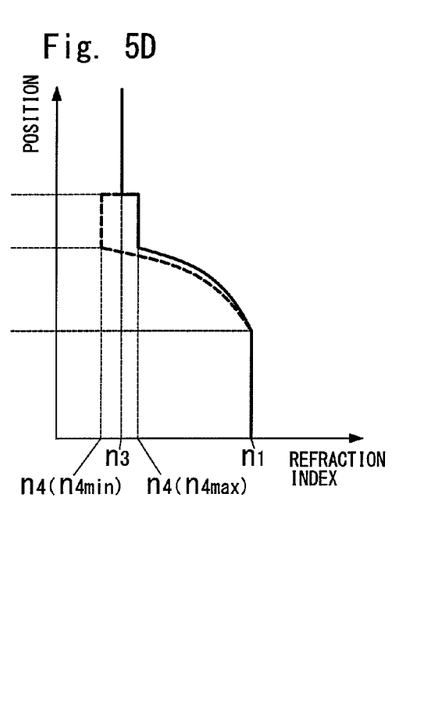
FIG. 5D is an explanation drawing for explaining said main section of said wavelength conversion member according to said Embodiment 2 of the present invention.

On the other hand, a base configuration of a light emitting device 1 in the present embodiment shown in FIG. 5A is the same as that in Embodiment 1. Then, as shown in FIGS. 5B, 5C and 5D, a wavelength conversion particle 7 in a wavelength conversion member 70 is characterized in that a translu-cent metal-oxide layer 77 is formed in the side of a surface of each fluorescent particle 71 which is formed with a moth-eye structure section 74. In addition, the same composition elements as Embodiment 1 are denoted by the same reference signs, and explanations thereof are omitted for clarity.

Preferably, a material of metal-oxide layer 77 has a refraction index being approximately the same as refraction index n3 of translucent medium 73. Then, the material may be selected appropriately from metallic compounds including at least one metal of Si, Ti, Al, Zr, Ge and Y as a constituent element, according to refraction index n3 of translucent medium 73. In addition, a refraction index of $SiO_2$ is 1.4 to 1.5, and a refraction index of $TiO_2$ is 2.3 to 2.55, and a refraction index of $Al_2O_3$ is 1.63, and a refraction index of $ZrO_2$ is 2.05, and a refraction index of $GeO_2$ is 1.99, and a refraction index of $Y_2O_3$ is 1.87.

Here, when a silicone resin or a glass is used as translucent medium 73, for example, $SiO_2$ may be used as the material of metal-oxide layer 77. Then, in the present embodiment, a thickness of metal-oxide layer 77 is set to be within a range of 100 nm to 150 nm. However, the range is one example, and the thickness is not limited to a particular range. Then, when $Al_2O_3$ or $Y_2O_3$ is used as the material of metal-oxide layer 77, a particle/resin composite (nano-composite) including a metallic composition such as Ti, Zr, Al, Y and Ge, for example, a metal-oxide nanoparticle in a silicone resin, or a silicone resin hybrid material including said metallic composition mixed or bonded at a molecular scale in a silicone resin, or a glass may be used as translucent medium 73. Then, when $ZrO_2$, $GeO_2$ or $TiO_2$ is used as the material of metal-oxide layer 77, a glass may be used as the material of translucent medium 73.

Figure 6A:
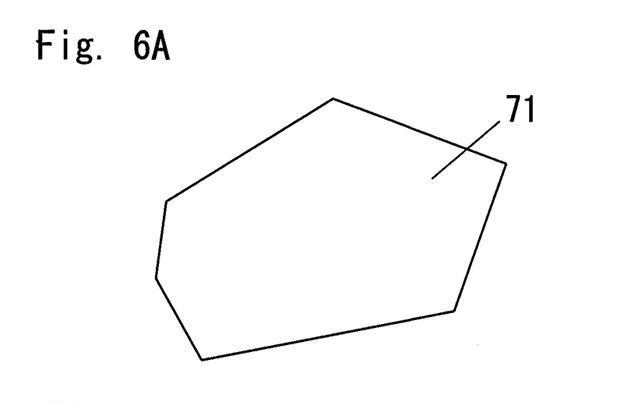
FIG. 6A is an explanation drawing for explaining a method for manufacturing a wavelength conversion particle according to said Embodiment 2 of the present invention.
Figure 6B:
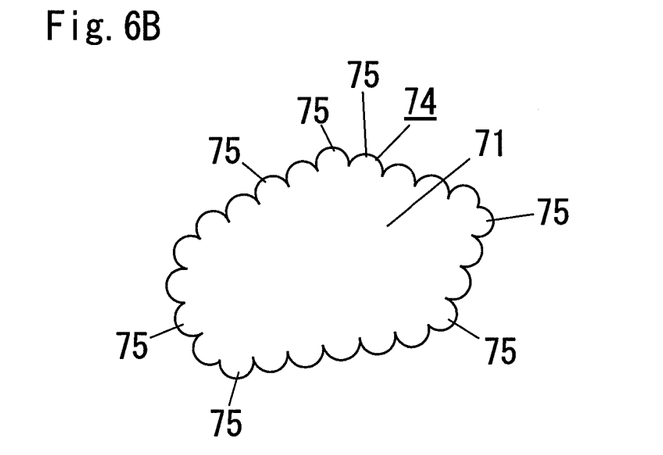
FIG. 6B is an explanation drawing for explaining said method for manufacturing said wavelength conversion particle according to said Embodiment 2 of the present invention.
Figure 6C:
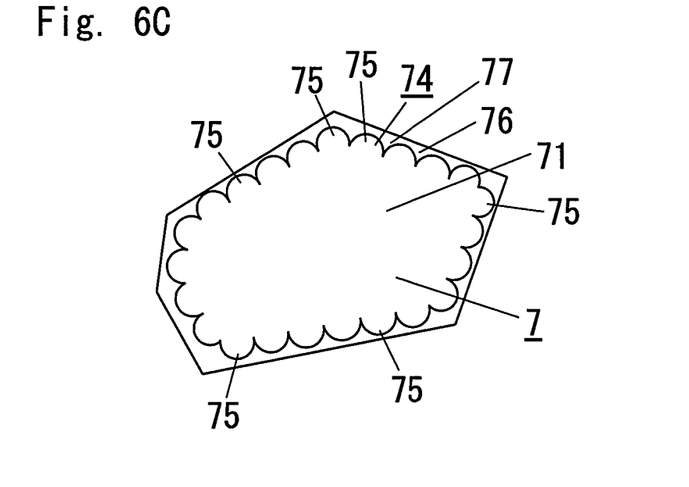
FIG. 6C is an explanation drawing for explaining said method for manufacturing said wavelength conversion particle according to said Embodiment 2 of the present invention.

Here, upon the manufacture of wavelength conversion member 70, a surface of fluorescent particle 71 shown in FIG. 6A is etched by using a wet etching method using a liquid solution of acid series or a dry etching method such as plasma etching explained in Embodiment 1. Thereby, moth-eye structure section 74 having a fine concavo-convex structure comprising many fine projections 75 is formed in the side of the surface of fluorescent particle 71 (see FIG. 6B). Then, metal-oxide layer 77 is formed in the side of the surface of fluorescent particle 71 by using, for example, sol-gel method, and thereby wavelength conversion particle 7 can be provided (see FIG. 6C). Then, a predetermined amount of wavelength conversion particles 7 are dispersed into a material of translucent medium 73 (for instance a silicone resin, a glass, an organic/inorganic hybrid material including an organic component and an inorganic component mixed or bonded at a nanometer scale or at a molecular scale and the like), and then the medium 73 including the particles 7 is formed into a dome-shape. In addition, the method of forming metal-oxide layer 77 is not limited to the sol-gel method, and metal-oxide layer 77 may be formed by, for example, plasma-deposition technique. Then, in order to form metal-oxide layer 77 precisely, thermal treatment may be performed as needed.

Here, as well as Embodiment 1, when a refraction index of fluore-scent particle 71 is denoted by "n1" and a refraction index of translucent medium 73 is denoted by "n3" and a refraction index of metal-oxide layer 77 is denoted by "n4", an effective refraction index of antireflection section 76 continuously changes between refraction index n1 of fluorescent particle 71 and refraction index n4 of metal-oxide layer 77, as shown in FIG. 5D, in a thickness direction of antireflection section 76 (a direction perpendicular to a envelope curve of a fine projection 75, and specifically, a vertical direction in FIG. 5C). Accordingly, if refraction index n4 of metal-oxide layer 77 is the same as refraction index n3 of translucent medium 73, the effective refraction index of antireflection section 76 continuously changes between refraction index n1 of fluorescent particle 71 and refraction index n3 of translucent medium 73, in the thickness direction of antireflection section 76. So, preferably, refraction index n4 of metal-oxide layer 77 is approximately the same as refraction index n3 of translucent medium 73, more preferably, is the same as refraction index n3. In the present embodiment, refraction index n4 of metal-oxide layer 77 is approximately the same as refraction index n3 of translucent medium 73, and then in regard to refraction index n4 of metal-oxide layer 77, n4max and n4min in FIG. 5D are an upper limit and a lower limit of refraction index n4, which is considered to be approximately the same as refraction index n3 of translucent medium 73, respectively.

Figure 7:
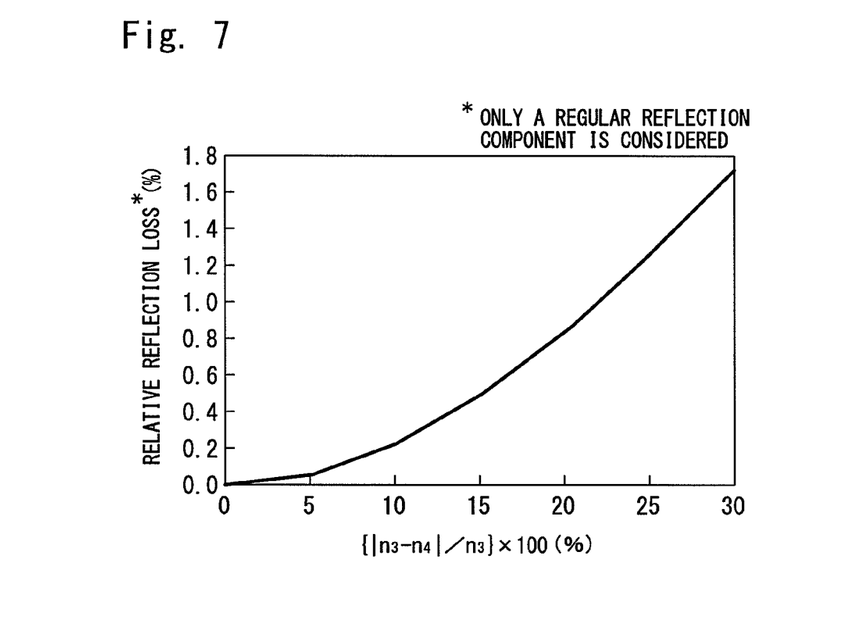
FIG. 7 is an explanation drawing for explaining said main section of said wavelength conversion member according to said Embodiment 2 of the present invention.

Here, in order to define a range for considering that refraction index n4 of metal-oxide layer 77 is approximately the same as refraction index n3 of translucent medium 73, a simulation result of a relationship between a ratio ($\{|n3-n4|/n3\}*100$) and a relative reflection loss (a relative value of reflection loss when only a regular reflection component is considered) is shown in FIG. 7. Here, ($\{|n3-n4|/n3\}*100$) is a ratio of a difference ($|n3-n4|$) between refraction index n3 of translucent medium 73 and refraction index n4 of metal-oxide layer 77 to refraction index n3 of translucent medium 73, and then the relative reflection loss occurs at an interface (a refraction index interface) between translucent medium 73 and metal-oxide layer 77. As can be expected from FIG. 7, when the ratio of the difference to refraction index n3 is more than or equal to 22%, the relative reflection loss occurring at the interface (the refraction index interface) between translucent medium 73 and metal-oxide layer 77 is more than 1%. Meanwhile, in light emitting device 1 of Practical Example 1, a rise rate of the efficiency for extracting light to Comparative Example 1 is 15%. Thus, 1% in the relative reflection loss is not negligible. So, when the ratio of the difference to refraction index n3 is less than or equal to 15% (the relative reflection loss is less than or equal to 0.5%), it is considered that refraction index n4 of metal-oxide layer 77 is approximately the same as refraction index n3 of translucent medium 73.

As explained above, wavelength conversion particle 7 of the present embodiment is formed with translucent metal-oxide layer 77 in the side of a surface of fluorescent particle 71. Thus, metal-oxide layer 77 functions as a barrier layer preventing extraneous moisture from reaching fluorescent particle 71, and moisture resistance can be improved (the layer 77 can prevent that properties of fluorescent particle 71 deteriorate due to the moisture influence). As a result, freedom to choose materials of fluorescent particle 71 increases.

Then, wavelength conversion member 70 of the present embodiment is formed by dispersing wavelength conversion particle(s) 7 into translucent medium 73 having a smaller refraction index than fluorescent particle 71, and then translucent medium 73 further has approximately the same refraction index as metal-oxide layer 77. Wavelength conversion member 70 is further provided with antireflection section 76 in the side of a surface of fluorescent particle 71, and antireflection section 76 comprises moth-eye structure section 74 and metal-oxide layer 77 entered between taper-shaped fine projections 75 of moth-eye structure section 74. As a result, in a thick-ness direction of antireflection section 76, an effective refraction index of antireflection section 76 changes continuously between refraction index n1 of fluorescent particle 71 and refraction index n3 of translucent medium 73. Accordingly, wavelength conversion member 70 of the present embodiment can further improve incident efficiency of the exciting light incident upon fluorescent particle 71 and efficiency for extracting conversion light from fluorescent particle 71. In addition, since refraction index n4 of metal-oxide layer 77 is approximately the same as refraction index n3 of translucent medium 73, wavelength conversion member 70 can improve moisture resistance, and can prevent a reduction in antireflection effect of moth-eye structure section 74, and can prevent reflection of exciting light.

Then, as well as Embodiment 1, wavelength conversion member 70 in light emitting device 1 of the present embodiment is also used as a color conversion member which converts a part of light emitted from LED chip 10 into light having a longer wavelength than the light emitted from LED chip 10, and emits the converted light. Therefore, light emitting device 1 can further improve incident efficiency of exciting light incident upon fluorescent particle 71 and efficiency for extracting conversion light from fluorescent particle 71 in the color conversion member, and thus can provide higher light output.

Practical Example 2

In this practical example, a blue LED chip having an emission peak wavelength of 460 nm was used as LED chip 10 of light emitting device 1 explained in Embodiment 2. In regard to wavelength conversion member 70, a silicone resin having a refraction index of 1.4 was used as translucent medium 73. In regard to fluorescent particle 71, a fluorescent particle having a refraction index of 1.9 and a center particle diameter d50 of 8 μm was used as a green fluorescent particle, and its composition is expressed as $CaSc_2O_4:Ce3+$. Furthermore, a fluorescent particle having a refraction index of 2.0 and a center particle diameter d50 of 10 μm was used as a red fluorescent particle, and its composition is expressed as $CaAlSiN_3:Eu2+$.

Here, in regard to green and red fluorescent particles, a predetermined amount of fluorescent particles 71 (a predetermined amount of green fluorescent particles or a predetermined amount of orange fluorescent particles) were dispersed into a pure water, when wavelength conversion particle 7 was formed in the manufacture of wavelength conversion member 70. Then, nitric acid was mixed with the water including fluorescent particles 71, and then the mixture was agitated. Then, slurry obtained by the agitation was filtered and washed, and thereby moth-eye structure section 74 was formed in the side of a surface of each fluorescent particle 71. Here, moth-eye structure section 74 had the fine concavo-convex structure having the arithmetic mean roughness Ra of 150 nm and the average contour curve element length RSm of 150 nm. After that, in regard to green and red fluorescent particles formed with moth-eye structure sections 74, a predetermined amount of fluorescent particles 71 (a predetermined amount of green fluorescent particles or a predetermined amount of red fluorescent particles), TEOS (Tetraethylorthosilicate), a water and an acetic acid as a catalytic agent were mixed and agitated in an isopropanol at 60 degrees C. during a predetermined time (12 hours), and slurry obtained by the agitation was filtered and washed, and then was dried at 80 degrees C. Furthermore, thermal treatment was performed at 300 degrees C., and thereby metal-oxide layer 77 comprising a $SiO_2$ layer having a refraction index of 1.5 was formed. In this way, wavelength conversion particle 7 was manufactured. Furthermore, after that a predetermined amount of wavelength conversion particles 7 were dispersed into a silicone resin having a refraction index of 1.4, and the silicone resin including the particles 7 was formed into a dome-shape, and thereby wavelength conversion member 70 was formed. After that light emitting device 1 was assembled. So, light emitting device 1 of Practical Example 2 is the same as that of Practical Example 1 except that wavelength conversion particle 7 is formed with metal-oxide layer 77.

In Regard to Practical Example 2 explained above, an accelerated reliability test was performed under conditions of temperature of 85 degrees C., relative humidity of 85% RH and intermittent energization (a repetitive cycle of activating during 30 minutes and inactivating during 30 minutes). Then, the following Table 2 shows a total luminous flux measured before the start of the accelerated reliability test and a total luminous flux measured after 1000 hours had passed since the start of the test with respect to Practical Example 2, together with the results of Practical Example 1 and Comparative Example 1. Then, Table 2 shows relative values defined with reference to the total luminous flux of Comparative Example 1 measured before the start of the test as 100.

TABLE 2

|  | AFTER 0 HOUR (BEFORE START OF TEST) | AFTER 1000 HOURS |
|---|---|---|
| COMPARATIVE EXAMPLE 1 | 100 | 32 |
| PRACTICAL EXAMPLE 1 | 115 | 75 |
| PRACTICAL EXAMPLE 2 | 115 | 104 |

Then, in Table 2, it is found that the total luminous flux before the start of the test in light emitting device 1 of Practical Example 2 is increased compared to that in Comparative Example 1, like Practical Example 1. Furthermore, it is found that deterioration of the total luminous flux after 1000 hours in Practical Example 2 is less than that in Practical Example 1. Therefore, higher light output can be provided and moisture resistance can be improved. That is, by comparing Practical Example 2 with Practical Example 1, it is found that the moisture resistance of Practical Example 2 comprising metal-oxide layer 77 is improved compared to that of Practical Example 1 not comprising metal-oxide layer 77.

Incidentally, the structure of light emitting device 1 applying wave-length conversion member 70 is not limited to structures explained in the embodiments and the practical examples, and also the shape of wavelength conversion member 70 is not limited to a dome-shape and for instance may be a sheet-shape.

Although the present invention has been described with reference to certain preferred embodiments, numerous modifications and variations can be made by those skilled in the art without departing from the true spirit and scope of this invention, namely claims.

The invention claimed is:

1. A wavelength conversion particle, being formed by using a fluorescent particle, absorbing incident exciting light, emitting light having a longer wavelength than the incident exciting light,
   wherein said wavelength conversion particle is provided with a moth-eye structure section having a fine concavo-convex structure in the side of a surface of said fluorescent particle,
   wherein said fine concavo-convex structure is formed in said fluorescent particle itself, and
   wherein said fine concavo-convex structure includes fine protections, each of which has a hemispherical shape.

2. The wavelength conversion particle as claimed in claim 1, being further formed with a translucent metal-oxide layer in the side of the surface of said fluorescent particle.

3. A wavelength conversion member, being formed by dispersing said wavelength conversion particle as claimed in claim 2 into a translucent medium having a smaller refraction index than said fluorescent particle, said translucent medium further having approximately the same refraction index as said metal-oxide layer,
   wherein said wavelength conversion member is provided with an antireflection section in the side of the surface of said fluorescent particle, wherein said antireflection section comprises said moth-eye structure section, and said metal-oxide layer entered between taper-shaped fine projections of said moth-eye structure section.

4. The wavelength conversion member as claimed in claim 3, wherein said translucent medium is a silicone resin or a glass.

5. A light emitting device comprising:
a LED chip; and
a color conversion member converting a part of light emitted from said LED chip into light having a longer wavelength than the light emitted from said LED chip, and emitting the converted light,
wherein said wavelength conversion member as claimed in claim 3 is used as said color conversion member.

6. A wavelength conversion member, being formed by dispersing said wavelength conversion particle as claimed in claim 1 into a translucent medium having a smaller refraction index than said fluorescent particle,
wherein said wavelength conversion member is provided with an antireflection section in the side of the surface of said fluorescent particle,
wherein said antireflection section comprises said moth-eye structure section, and said translucent medium entered between taper-shaped fine projections of said moth-eye structure section.

7. The wavelength conversion member as claimed in claim 6, wherein said translucent medium is a silicone resin or a glass.

8. A light emitting device comprising:
a LED chip; and
a color conversion member converting a part of light emitted from said LED chip into light having a longer wavelength than the light emitted from said LED chip, and emitting the converted light,
wherein said wavelength conversion member as claimed in claim 6 is used as said color conversion member.

9. A light emitting device comprising:
a LED chip; and
a color conversion member converting a part of light emitted from said LED chip into light having a longer wavelength than the light emitted from said LED chip, and emitting the converted light,
wherein said wavelength conversion member as claimed in claim 7 is used as said color conversion member.

10. The wavelength conversion particle as claimed in claim 1, wherein said fine projections are closely arranged so that adjacent fine projections contact each other, as a moth-eye structure.

11. A method for forming the wavelength conversion particle as claimed in claim 1, comprising a step of forming said fine concavo-convex structure by etching processing including one or more of chemical etching, thermal treatment, hydrothermal treatment and plasma etching.

* * * * *